United States Patent
Wakahara et al.

(10) Patent No.: US 9,853,239 B2
(45) Date of Patent: Dec. 26, 2017

(54) SURFACE LIGHT-EMITTING UNIT

(71) Applicant: KONICA MINOLTA INC., Chiyoda-ku (JP)

(72) Inventors: Junya Wakahara, Settsu (JP); Nobuya Miki, Ibaraki (JP); Yasuhiro Sando, Amagasaki (JP)

(73) Assignee: Konica Minolta, Inc., Tokyo (JP)

( * ) Notice: Subject to any disclaimer, the term of this patent is extended or adjusted under 35 U.S.C. 154(b) by 0 days.

(21) Appl. No.: 14/916,926

(22) PCT Filed: Aug. 20, 2014

(86) PCT No.: PCT/JP2014/071711
§ 371 (c)(1),
(2) Date: Mar. 4, 2016

(87) PCT Pub. No.: WO2015/033775
PCT Pub. Date: Mar. 12, 2015

(65) Prior Publication Data
US 2016/0197301 A1 Jul. 7, 2016

(30) Foreign Application Priority Data
Sep. 4, 2013 (JP) ................................. 2013-182971

(51) Int. Cl.
*H01L 51/52* (2006.01)
*H01L 27/32* (2006.01)

(52) U.S. Cl.
CPC ........ *H01L 51/524* (2013.01); *H01L 27/3204* (2013.01); *H01L 51/52* (2013.01); *H01L 51/5203* (2013.01); *H01L 2251/5361* (2013.01)

(58) Field of Classification Search
None
See application file for complete search history.

(56) References Cited

U.S. PATENT DOCUMENTS

| | | | |
|---|---|---|---|
| 6,624,570 B1 | 9/2003 | Nishio et al. | |
| 2003/0047280 A1* | 3/2003 | Takayama | B32B 7/06 156/708 |
| 2009/0133916 A1 | 5/2009 | Grespan | |
| 2014/0265921 A1* | 9/2014 | Collins | F21V 19/00 315/297 |

FOREIGN PATENT DOCUMENTS

| | | |
|---|---|---|
| JP | 2000-133438 | 5/2000 |
| JP | 2007-220569 | 8/2007 |
| JP | 2011-238908 | 11/2011 |
| JP | 2012-133302 | 7/2012 |
| JP | 2013-102001 | 5/2013 |
| JP | 2013102001 A * | 5/2013 |

* cited by examiner

*Primary Examiner* — William Coleman
*Assistant Examiner* — Kien Ly
(74) *Attorney, Agent, or Firm* — Cozen O'Connor

(57) ABSTRACT

In a surface light-emitting unit, a wiring board (60) includes, on its side on which a holding substrate (11) is located, an external-wire connecting portion (40). An opening (11*h*) is provided in the holding substrate (11). The wiring board (60) is disposed to cover the opening (11*h*) and allow the external-wire connecting portion (40) to be exposed, through the opening (11*h*), toward a surface of the holding substrate (11) opposite to the surface thereof on which the wiring board (60) is held. With an external wire connected to the external-wire connecting portion (40), a surface of the wiring board (60) located in the opening (11*h*) is sealed by a second sealing member.

5 Claims, 4 Drawing Sheets

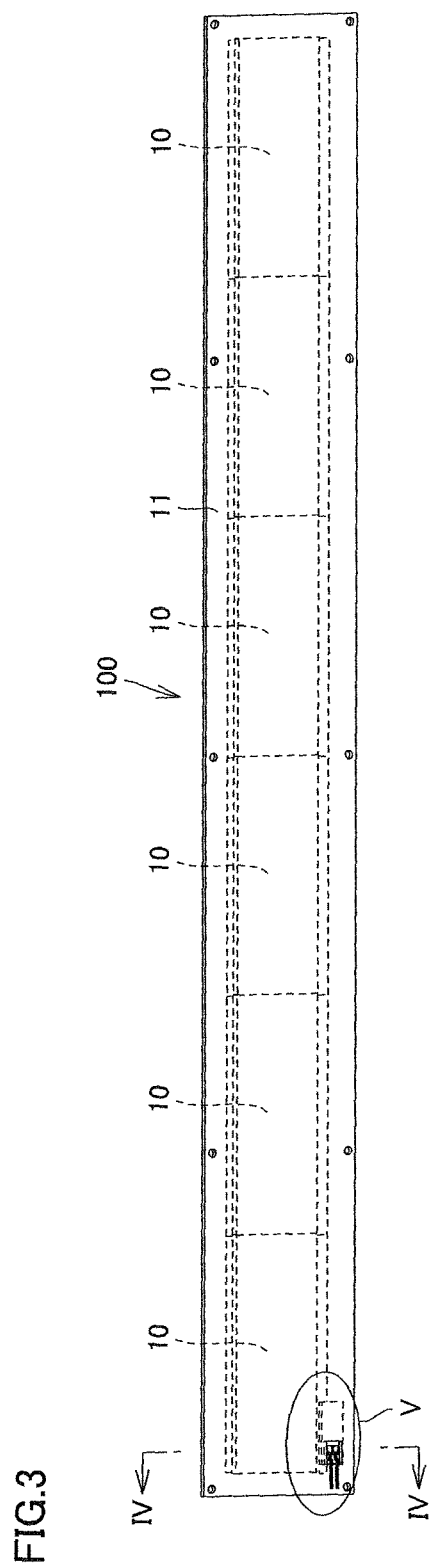

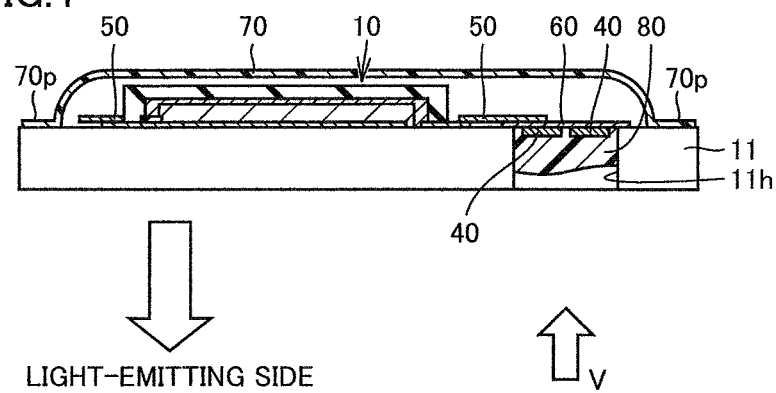
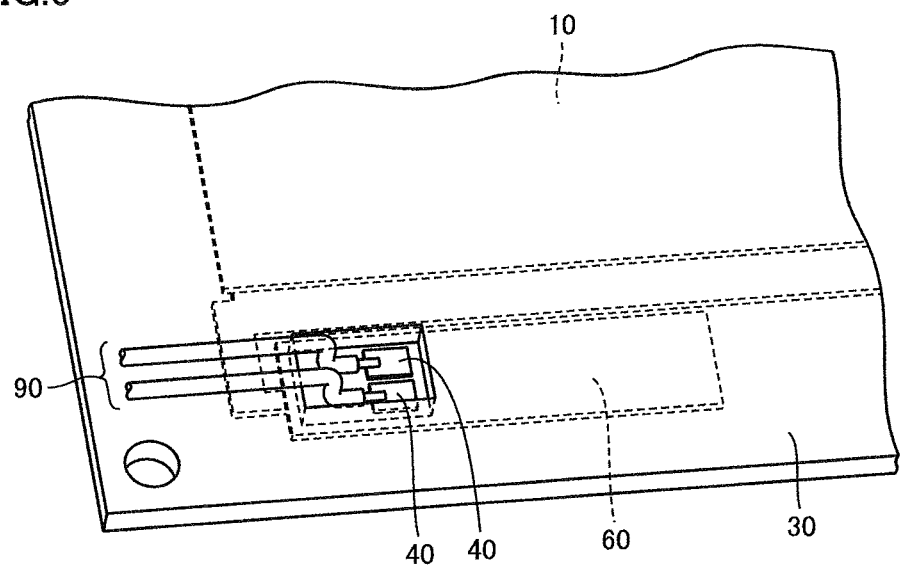

SURFACE LIGHT-EMITTING UNIT

RELATED APPLICATIONS

The present U.S. patent application is a U.S. National Phase Application under 35 USC 371 of International Application PCT/JP2014/071711 filed on Aug. 20, 2014. This application claims priority under the Paris Convention of Japanese patent application No. 2013-182971 filed on Sep. 4, 2013, the entirety of which is incorporated herein by reference.

TECHNICAL FIELD

The present invention relates to a structure of a surface light-emitting unit in which a surface light-emitting device is used.

BACKGROUND ART

Recently, a surface light-emitting unit has been proposed in which a planer light-emitting device using organic EL (electroluminescence) or the like is used. Japanese Laid-Open Patent Publication No. 2000-133438 (PTD 1) discloses an illuminating body that can be mounted on a curved portion and a method for manufacturing the illuminating body.

CITATION LIST

Patent Document

PTD 1: Japanese Laid-Open Patent Publication No. 2000-133438

SUMMARY OF INVENTION

Technical Problem

For the illuminating body disclosed in PTD 1, a structure is employed in which internal wires for a woven-fabric-like EL (electroluminescent) device are drawn out from a side surface of an insulating film and an insulating layer.

A surface light-emitting unit such as this illuminating body is required to be used outdoors and accordingly required to have a more stable connection structure for connecting with external wires.

The present invention has been made in view of the aforementioned problem, and an object of the present invention is to provide a surface light-emitting unit having a structure that enables connection with external wires to be more stable.

Solution to Problem

A surface light-emitting unit based on the present invention includes: a surface light-emitting device; a holding substrate holding the surface light-emitting device from a light-emitting surface of the surface light-emitting device, and transmitting light emitted from the surface light-emitting device; a wiring board held on a surface of the holding substrate that is the same as a surface on which the surface light-emitting device is held, and electrically connected to the surface light-emitting device; and a first sealing member sealing the surface light-emitting device and the wiring board on the holding substrate.

The wiring board includes an external-wire connecting portion on a side of the wiring board on which the holding substrate is located, an opening is provided in the holding substrate, the wiring board is disposed to cover the opening and allow the external-wire connecting portion to be exposed, through the opening, toward a surface of the holding substrate opposite to the surface on which the wiring board is held and, with an external wire connected to the external-wire connecting portion, a surface of the wiring board that is located in the opening is sealed by a second sealing member.

Advantageous Effects of Invention

In accordance with the present invention, a planer light-emitting unit having a structure that enables connection with external wires to be more stable can be provided.

BRIEF DESCRIPTION OF DRAWINGS

FIG. 3 is a plan view showing a schematic configuration of a surface light-emitting unit in an embodiment as seen from a light-emitting side of the surface light-emitting unit.

FIG. 4 is a cross-sectional view along IV-IV in FIG. 3 as seen in the direction of the arrows.

FIG. 5 is a diagram as seen in the direction of an arrow V in FIG. 4.

DESCRIPTION OF EMBODIMENTS

Figure 1:
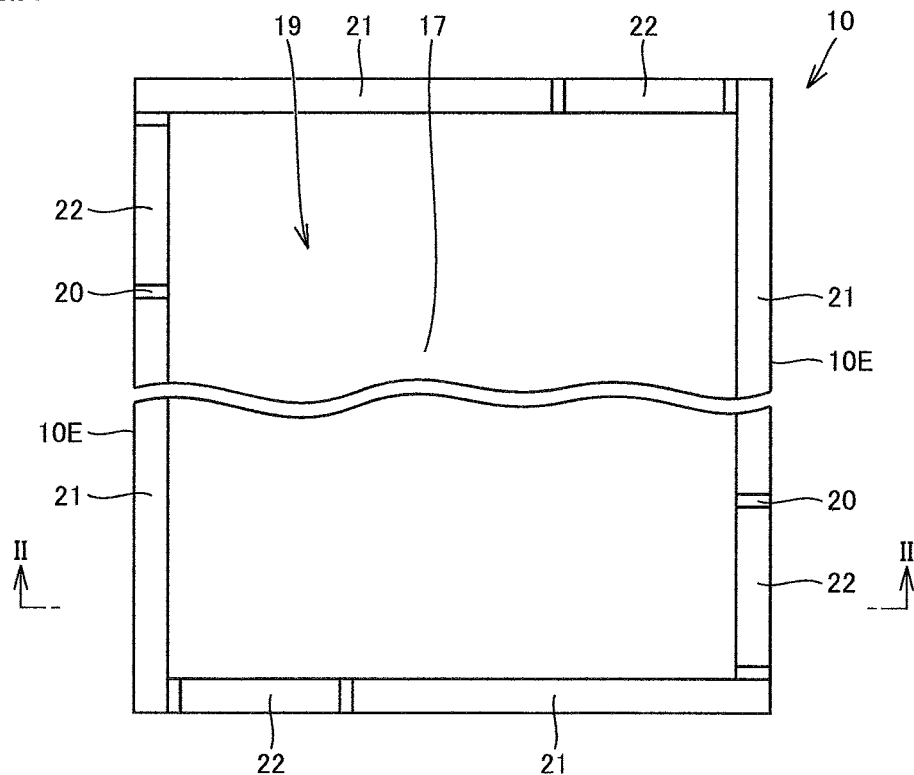
FIG. 1 is a plan view showing a basic configuration of a surface light-emitting panel including a surface light-emitting device in an embodiment.

In the following, a description will be given, with reference to the drawings, of a surface light-emitting device in each embodiment based on the present invention, a surface light-emitting panel in which this surface light-emitting device is used, and a surface light-emitting unit in which this surface light-emitting panel is used. In the case where the number, amount, or the like is mentioned in connection with embodiments described below, the scope of the present invention is not necessarily limited to the number, amount, or the like unless otherwise specified. The same parts or corresponding parts are denoted by the same reference numerals, and a description thereof will not be repeated in some cases. It is originally intended that characteristics of the embodiments are used in combination as appropriate.

Surface Light-Emitting Device 1 and Surface Light-Emitting Panel 10

Figure 2:
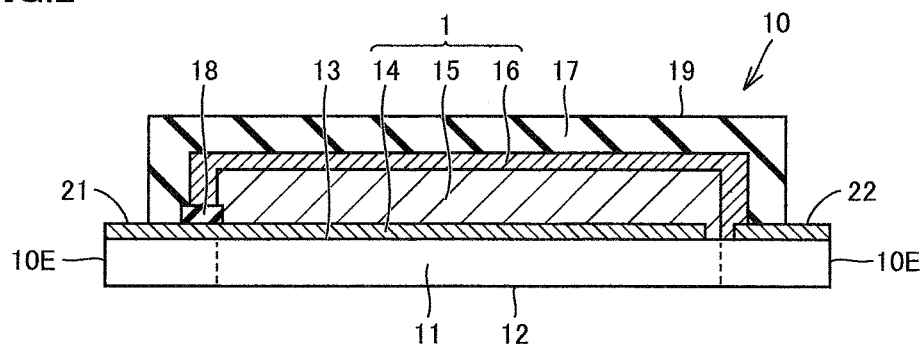
FIG. 2 is a cross-sectional view along II-II in FIG. 1 as seen in the direction of the arrows.

Referring to FIGS. 1 and 2, a basic configuration of a surface light-emitting panel 10 in the present embodiment will be described. FIG. 1 is a plan view showing surface light-emitting panel 10, illustrating surface light-emitting panel 10 as seen from a back surface 19 of surface light-emitting panel 10. FIG. 2 is a cross-sectional view along II-II in FIG. 1 as seen in the direction of the arrows.

Surface light-emitting panel 10 in the present embodiment is formed to include an organic electroluminescent device. Surface light-emitting panel 10 may be formed as a surface light-emitting panel made up of a plurality of light-emitting diodes (LED) and a diffusion plate or formed as a surface light-emitting panel in which cold cathode tubes or the like are used.

Referring to FIGS. 1 and 2, surface light-emitting panel 10 includes a holding substrate 11 (cover layer), a positive electrode (anode) 14, an organic layer 15, a negative electrode (cathode) 16, a sealing member 17, and an insulating layer 18. Positive electrode 14, organic layer 15, and negative electrode 16 constitute a surface light-emitting device 1.

Holding substrate 11 forms a front surface (light-emitting surface) of surface light-emitting panel 10, and the outer peripheral end face of holding substrate 11 forms an outer periphery 10E of surface light-emitting panel 10. Positive electrode 14, organic layer 15, and negative electrode 16 are stacked successively on a rear surface 13 of holding substrate 11. Sealing member 17 forms back surface 19 of surface light-emitting panel 10.

Holding substrate 11 holds surface light-emitting device 1 from a light-emitting surface of surface light-emitting device 1, and transmits light emitted from surface light-emitting device 1. Further, for holding substrate 11, a flexible material is used so as to enable a surface light-emitting unit described later herein to be bent.

As the flexible material, specifically a translucent film member such as polyethylene terephthalate (PET), polycarbonate (PC), polymethyl methacrylate (PMMA), or the like is used. As holding substrate 11, a thin-film glass substrate may also be used.

Other translucent and flexible film members to be used are polyimide, polyethylene naphthalate (PEN), polystyrene (PS), polyethersulfone (PES), polypropylene (PP), and the like.

Positive electrode 14 is a transparent and electrically-conductive film. In order to form positive electrode 14, sputtering or the like is used to deposit ITO (Indium Tin Oxide) or the like on rear surface 13 of holding substrate 11. As another material used for positive electrode 14, polyethylenedioxythiophene (PEDOT) is used.

Organic layer 15 (light-emitting portion) is capable of generating light (visible light) by being supplied with electric power. Organic layer 15 may be formed of a single light-emitting layer, or made up of a hole transport layer, a light-emitting layer, a hole block layer, and an electron transport layer or the like that are successively stacked.

Negative electrode 16 is aluminum (Al) for example. Negative electrode 16 is formed by vacuum vapor deposition or the like to cover organic layer 15. In order to pattern negative electrode 16 in a predetermined shape, a mask may be used when vacuum vapor deposition is performed. Any of other materials for negative electrode 16 such as lithium fluoride (LiF), a stack of Al and Ca, a stack of Al and LiF, and a stack of Al and Ba for example is used.

In order not to short circuit negative electrode 16 and positive electrode 14, insulating layer 18 is provided between negative electrode 16 and positive electrode 14. Insulating layer 18 is formed by depositing $SiO_2$ or the like by means of sputtering for example and thereafter patterning, by means of photolithography or the like, the deposited $SiO_2$ in a desired pattern to cover a portion for insulating positive electrode 14 and negative electrode 16 from each other.

Sealing member 17 is formed of an insulating resin or glass substrate. Sealing member 17 is formed in order to protect organic layer 15 from moisture and the like. Sealing member 17 seals substantially the whole of positive electrode 14, organic layer 15, and negative electrode 16 (namely the members provided inside surface light-emitting panel 10) on holding substrate 11. A part of positive electrode 14 is exposed from sealing member 17 for the sake of electrical connection (the left side in FIG. 2).

As sealing member 17, a multilayer member is used that is made up of a film of PET, PEN, PS, PES, polyimide, or the like, and a plurality of inorganic thin films of $SiO_2$, $Al_2O_3$, SiNx, or the like and flexible acrylic resin thin films or the like that are stacked together on the aforementioned film of PET or the like and accordingly has a gas barrier property. For an electrode portion 21 and an electrode portion 22, gold, silver, copper, or the like may additionally be deposited.

A portion (left side in FIG. 2) of positive electrode 14 that is exposed from sealing member 17 forms electrode portion 21 (for positive electrode). Electrode portion 21 and positive electrode 14 are made of the same material. Electrode portion 21 is located on the outer periphery of surface light-emitting panel 10. A portion (right side in FIG. 2) of negative electrode 16 that is exposed from sealing member 17 forms electrode portion 22 (for negative electrode). Electrode portion 22 and negative electrode 16 are made of the same material. Electrode portion 22 is also located on the outer periphery of surface light-emitting panel 10.

Electrode portion 21 and Electrode portion 22 are located opposite to each other with organic layer 15 therebetween. Between electrode portion 21 and electrode portion 22 adjacent to each other, a separation region 20 (see FIG. 1) is formed. To electrode portion 21 and electrode portion 22, a wiring pattern (not shown) is attached by means of soldering (silver paste) or the like.

To organic layer 15 of surface light-emitting panel 10 formed in the above-described manner, electric power is supplied from an external wiring board 60 (see FIG. 4) described later herein, through a wiring member 50 (see FIG. 4), electrode portions 21, 22, positive electrode 14, and negative electrode 16. Light generated by organic layer 15 is extracted to the outside from front surface (light-emitting surface) 12 through positive electrode 14 and holding substrate 11.

In front surface 12, a region corresponding to organic layer 15 forms a light-emitting region emitting light, and the outside region surrounding the light-emitting region is a non-light-emitting region. In the present embodiment, the size of the outline of holding substrate 11 is 100 mm×100 mm and the light-emitting region has a size of the outline of 90 mm×90 mm. The width of the non-light-emitting region is thus 5 mm.

Surface Light-Emitting Unit 100

Referring next to FIGS. 3 to 5, a description will be given of a schematic configuration of a surface light-emitting unit 100 in which surface light-emitting panel 10 having the above-described configuration is used. FIG. 3 is a plan view showing a schematic configuration of surface light-emitting unit 100 as seen from a light-emitting side of surface light-emitting unit 100, FIG. 4 is a cross-sectional view along IV-IV in FIG. 3 as seen in the direction of the arrows, and FIG. 5 is a diagram as seen in the direction of an arrow V in FIG. 4.

In surface light-emitting unit 100 in the present embodiment, six surface light-emitting panels 10 are formed on one slender holding substrate 11. Surface light-emitting panels 10 are connected in series in the present embodiment. Surface light-emitting device 1 of surface light-emitting panel 10 is bonded with an optical adhesive member so that a light-emitting surface of the surface light-emitting device faces holding substrate 11. The number of surface light-emitting panels 10 to be provided in the unit is not limited but changed appropriately depending on design specification.

In one end of surface light-emitting unit 100, wiring board 60 is disposed on a main surface (the same side as the side on which surface light-emitting device 1 is disposed) of holding substrate 11 that is opposite to a light emitting side of holding substrate 11.

To each of a positive electrode and a negative electrode of each surface light-emitting panel 10, a wiring member 50 is connected, and six surface light-emitting panels 10 are connected in series. On a side of wiring board 60 opposite to a light-emitting side thereof, two opposite ends of the series-connected positive electrodes are connected with corresponding two opposite ends of the-series connected negative electrodes.

On holding substrate 11, surface light-emitting panel 10, wiring member 50, and wiring board 60 are sealed by a first sealing member 70. As this first sealing member 70, a flexible resin film is used that is provided with a sealing region 70p along its periphery in order to improve its outdoor dust-proof and drip-proof capability. The width of sealing region 70p is approximately 10 mm, for example. Since first sealing member 70 should be flexible and electrically insulating, first sealing member 70 is preferably made from resin.

The material for the flexible resin film may be polyethylene terephthalate (PET), polycarbonate (PC), polymethyl methacrylate (PMMA), polyimide, polyethylene naphthalate (PEN), polystyrene (PS), polyethersulfone (PES), polypropylene (PP), or the like.

On a side of wiring board 60 on which holding substrate 11 is located, external-wire connecting portions 40 for the positive electrode and the negative electrode are provided. In holding substrate 11, an opening 11h is provided. Wiring board 60 is disposed to cover opening 11h from the side of holding substrate 11 which is opposite to the light-emitting surface thereof, and expose, through opening 11h, external-wire connecting portion 40 toward the light-emitting surface side. The outline of opening 11h is smaller than the outline of wiring board 60 as seen in a plan view. Therefore, opening 11h is covered by wiring board 60 without forming a gap between wiring board 60 and holding substrate 11.

On wiring board 60, respective lands of the positive electrode and the negative electrode of external-wire connecting portions 40 are supplied with electric power through external wires 90 (see FIG. 5) to thereby energize surface light-emitting panel 10 and cause surface light-emitting panel 10 to emit light. External-wire connecting portion 40 and external wire 90 are electrically connected by soldering or the like. In this way, external wire 90 is drawn out from the light-emitting surface side of surface light-emitting unit 100.

In opening 11h in which external wire 90 is connected to external-wire connecting portion 40, the surface of wiring board 60 located in opening 11h is covered with and sealed by a second sealing member 80 for waterproofing mounted parts, the wiring pattern, and the wire connecting portion on wiring board 60. For second sealing member 80, a resin material (silicone resin potting material for example) is used. The resin material is injected into opening 11h to seal opening 11h. Preferably, second resin member 80 is made from resin in terms of the ease of handling for manufacture and electrical insulation of the resin.

While first sealing member 70 is provided with sealing region 70p along its outer periphery in order to have the dust-proof and drip-proof capability against outdoor use, opening 11h can be filled with the resin material to have an adequate dust-proof and drip-proof capability.

Figure 6:
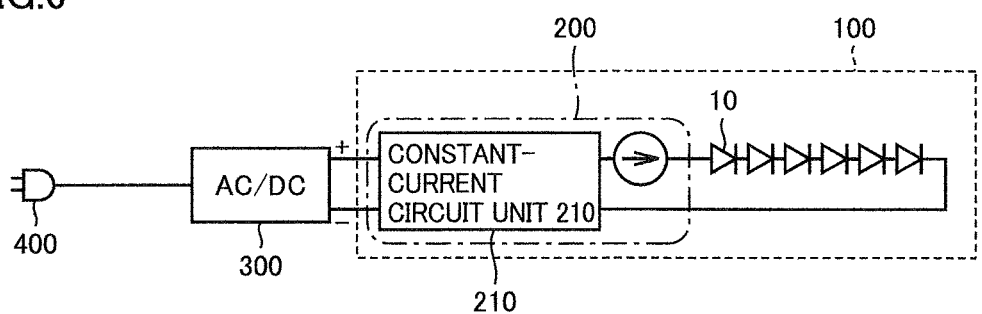
FIG. 6 is a block diagram where a drive control unit is mounted in a surface light-emitting unit in an embodiment.
Figure 7:
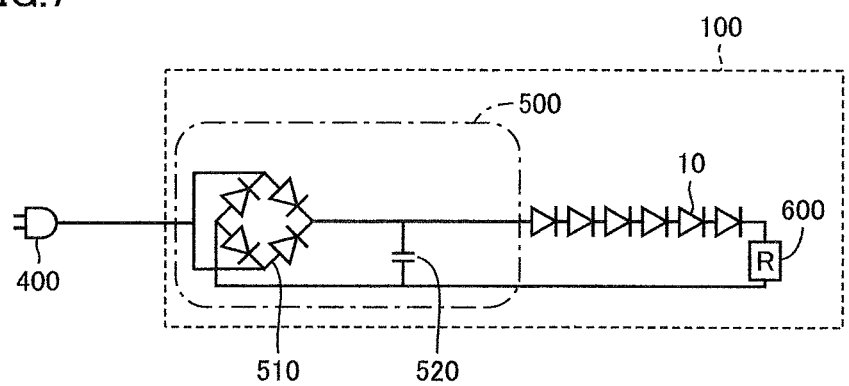
FIG. 7 is a block diagram where a rectifying circuit unit is mounted in a surface light-emitting unit in an embodiment.

Referring next to FIGS. 6 and 7, a circuit configuration of surface light-emitting unit 100 in the present embodiment will be described. FIG. 6 is a block diagram where a drive control unit 200 is mounted in surface light-emitting unit 100, and FIG. 7 is a block diagram where a rectifying circuit unit 500 is mounted in surface light-emitting unit 100.

In surface light-emitting unit 100, surface light-emitting panels 10 are preferably driven with constant current in order to reduce unevenness of the brightness due to differences between surface light-emitting panels 10. For surface light-emitting unit 100 in the present embodiment shown in FIGS. 3 and 4, constant current generated by an external drive circuit unit (not shown) is applied from external wire 90 to thereby drive surface light-emitting panels 10.

As to another method for driving surface light-emitting panel 10, as shown in FIG. 6, drive control unit 200 (driver IC) generating constant current may be mounted on wiring board 60 so as to apply direct current to surface light-emitting panel 10. In the block diagram shown in FIG. 6, an AC/DC power supply 300 provided outside is connected to a constant-current circuit unit 210 of drive control unit 200.

As to still another method for driving surface light-emitting panel 10, as shown in FIG. 7, rectifying circuit unit (AC/DC conversion circuit) 500 may be mounted on wiring board 60 so as to directly apply alternating current which is generally supplied as external current. In the block diagram shown in FIG. 7, the rectifying circuit unit (AC/DC conversion circuit 500) includes a bridge circuit 510, a low-pass filter 520, and a limiting resistor 600.

As seen from the foregoing, for surface light-emitting unit 100 in the present embodiment, the configuration is employed in which external wire 90 is drawn out from the light-emitting surface side of surface light-emitting unit 100 through opening 11h in holding substrate 11, and the surface of wiring board 60 located in opening 11h is sealed by second sealing member 80 in order to waterproof mounted parts, the wiring pattern, and the wire connecting portion on wiring board 60. Accordingly, regardless of this simple configuration, connection with the external wire can be made more stable while the waterproofness is kept even when the surface light-emitting unit is used outdoors. Further, expansion of the non-light-emitting region can be minimized and wiring work can easily be done.

In order to achieve the sealing capability which is enough for surface light-emitting unit 100 to endure outdoor use, a conventional approach is to attach sealing region 70p of first sealing member 70 directly to the holding substrate so that the joint between the sealing region and the holding substrate has a constant width. In the case of this manner of sealing, however, if external wire 90 is drawn out from the lateral side, external wire 90 is caught between holding substrate 11 and first sealing member 70 at the location where external wire 90 is drawn out from the lateral side, which makes it difficult to achieve the adequate sealing capability at this location where the wire is drawn out.

In order to ensure that the sealing capability is achieved at the location where external wire 90 is drawn out, the width of sealing region 70p of first sealing member 70 may be increased. In this case, however, the surface light-emitting unit has a wide non-light-emitting region (bezel portion).

In the case where a plurality of such surface light-emitting units are tiled, the non-light-emitting portion at the joint between the light-emitting units is larger and unevenness of the brightness of the light-emitting surface is larger, leading to deterioration of the uniformity of illumination. Further, in the case where such surface light-emitting units are tiled on a wall surface, a disadvantage occurs. Specifically, because the wire is drawn out from the lateral side and arranged so as not to cause interference between respective lateral sides of adjacent surface light-emitting units and the external wire, the surface light-emitting units cannot be arranged in such a manner that the surface light-emitting units are arranged closely to each other. Furthermore, as for the workability in wiring after the surface light-emitting units are mounted on the wall surface, the external wire drawn out from the lateral side has to be bent toward the light-emitting surface side and thereafter further bent in a desired direction, which results in a problem that the workability for wiring is not high.

In contrast, regarding surface light-emitting unit 100 in the present embodiment, the external wire is not drawn out from the lateral side of surface light-emitting unit 100 and therefore, it is unnecessary to provide, in the peripheral portion of holding substrate 11, a region for drawing out the external wire from the lateral side. Accordingly, the width of sealing region 70p necessary for sealing surface light-emitting panel 10, wiring member 50, and wiring board 60 by first sealing member 70 can be minimized. As a result, expansion of the non-light-emitting region (bezel portion) of surface light-emitting unit 100 can be minimized.

Further, in the case where a plurality of such surface light-emitting units 100 are arranged side by side as well, the ratio of the light-emitting portion to the total tiling area is high and thus they can be arranged efficiently. Furthermore, since the unevenness in brightness due to a difference in brightness between the non-light-emitting portion and the light-emitting portion can be reduced, high-definition lighting can be obtained.

Moreover, use of a flexible material for holding substrate 11 enables surface light-emitting unit 100 to be mounted on a curved portion such as a wall surface in a tunnel, and also enables broadening of application to lighting with an excellent design adapted advantageously to a curved shape. Particularly in the case where surface light-emitting unit 100 is attached to a location such as a wall surface in a tunnel where attachment through the back surface of surface light-emitting unit 100 is difficult, external wire 90 for surface light-emitting unit 100 in the present embodiment is drawn out from the light-emitting surface side and therefore wiring work when this surface light-emitting unit 100 is attached to the wall surface can easily be done, since the work is merely required to bend the external wire in a desired direction.

While the surface light-emitting unit in the embodiments of the present invention has been described, it should be construed that the embodiments disclosed herein are given by way of illustration in all respects, not by way of limitation. It is therefore intended that the scope of the present invention is defined by claims, and encompasses all modifications and variations equivalent in meaning and scope to the claims.

REFERENCE SIGNS LIST 1 surface light-emitting device; 10 surface light-emitting panel; 10E outer periphery; 11 holding substrate; 11h opening; 12 front surface; 13 rear surface; 14 positive electrode; 15 organic layer; 16 negative electrode; 17 sealing member; 18 insulating layer; 19 back surface; 40 external-wire connecting portion; 50 wiring member; 60 wiring board; 70 first sealing member; 70p sealing region; 80 second sealing member; 90 external wire; 200 drive control unit; 210 constant-current circuit unit; 500 rectifying circuit unit (AC/DC conversion circuit); 510 bridge circuit; 520 low-pass filter; 600 limiting resistor.

The invention claimed is:
1. A surface light-emitting unit comprising:
a surface light-emitting device;
a holding substrate having a first surface facing a light-emitting surface of the surface light-emitting device, and transmitting light emitted from the surface light-emitting device through a second surface opposite said first surface;
a wiring board located on said first surface of the holding substrate, and electrically connected to the surface light-emitting device;
a first sealing member sealing the surface light-emitting device and the wiring board on the holding substrate;
the wiring board including an external-wire connecting portion on a side of the wiring board on which the holding substrate is located;
an opening formed in the holding substrate;
the wiring board being disposed to cover the opening and allow the external-wire connecting portion to be exposed, through the opening, toward said second surface of the holding substrate;
with an external wire connected to the external-wire connecting portion, a surface of the wiring board that is located in the opening is sealed by a second sealing member, and
wherein the wiring board includes a drive control unit.
2. The surface light-emitting unit according to claim 1, wherein the wiring board includes a rectifying circuit unit.
3. The surface light-emitting unit according to claim 1, wherein a flexible material is used for the holding substrate.
4. The surface light-emitting unit according to claim 1, wherein the surface light-emitting device includes an organic EL device.
5. The surface light-emitting unit according to claim 1, wherein the surface light-emitting device, the wiring board, and the external-wire connecting portion are all sealed by the holding substrate, the first sealing member, and the second sealing member.

* * * * *